(12) United States Patent
Asako et al.

(10) Patent No.: US 9,461,464 B2
(45) Date of Patent: Oct. 4, 2016

(54) DRIVE UNIT FOR SWITCHING ELEMENT AND METHOD THEREOF

(71) Applicant: DENSO CORPORATION, Kariya, Aichi-pref. (JP)

(72) Inventors: Yousuke Asako, Anjo (JP); Tsuneo Maebara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 590 days.

(21) Appl. No.: 13/845,726

(22) Filed: Mar. 18, 2013

(65) Prior Publication Data
US 2013/0301318 A1  Nov. 14, 2013

(30) Foreign Application Priority Data
May 10, 2012 (JP) .................. 2012-108126

(51) Int. Cl.
| | | |
|---|---|---|
| H02M 7/537 | (2006.01) | |
| H02H 9/02 | (2006.01) | |
| H03K 17/082 | (2006.01) | |
| H03K 17/08 | (2006.01) | |

(52) U.S. Cl.
CPC ............ *H02H 9/02* (2013.01); *H03K 17/0828* (2013.01); *H03K 2017/0806* (2013.01); *H03K 2217/0027* (2013.01)

(58) Field of Classification Search
CPC ...... H02M 7/003; H02M 7/537; H02H 3/08; H02H 9/02; H03K 2017/0806
USPC .................. 363/50, 131, 132; 327/100, 109; 361/87, 109
See application file for complete search history.

(56) References Cited

U.S. PATENT DOCUMENTS

| | | | | |
|---|---|---|---|---|
| 6,424,871 B1 * | 7/2002 | Nakajima | .......... | H02K 11/0073 700/11 |
| 8,704,556 B2 * | 4/2014 | Hamanaka | .......... | H03K 17/567 327/109 |

(Continued)

FOREIGN PATENT DOCUMENTS

| | | |
|---|---|---|
| JP | 06-209519 | 7/1994 |
| JP | 10-170008 | 6/1998 |

(Continued)

OTHER PUBLICATIONS

Office Action (3 pages) dated Apr. 22, 2014, issued in corresponding Japanese Application No. 2012-108126 and English translation (4 pages).

*Primary Examiner* — Yemane Mehari
(74) *Attorney, Agent, or Firm* — Nixon & Vanderhye P.C.

(57) ABSTRACT

The present application provides a drive unit for a switching element, the driving unit having a function that is capable of promptly detecting the flow of excess current. The unit is usable for an electrical rotating machine. A drive unit for a switching element, comprising: a sense terminal output current detecting means for detecting an output current of a sense terminal that outputs a minute current having correlation with a current flowing between an input terminal and an output terminal of a switching element; a switching element drive control means for restricting the driving of the switching element when the output current detected by the sense terminal output current detecting means exceeds a predetermined threshold value; and a threshold changing means for changing the threshold value on the basis of a difference of electric potential between the input terminal and the output terminal of the switching element.

20 Claims, 7 Drawing Sheets

SYSTEM CONFIGURATION DIAGRAM ACCORDING TO FIRST EMBODIMENT

(56) References Cited

U.S. PATENT DOCUMENTS

2004/0201935 A1* 10/2004 Yamamoto .................. 361/93.1
2004/0228057 A1    11/2004 Mayama et al.
2010/0254055 A1    10/2010 Vanderzon
2012/0024552 A1*  2/2012 Kawano et al. .................. 173/2

FOREIGN PATENT DOCUMENTS

| JP | 3474775 | 9/2003 |
| JP | 2004-248454 | 9/2004 |
| JP | 2008-141390 | 6/2008 |

* cited by examiner

FIG.1 SYSTEM CONFIGURATION DIAGRAM ACCORDING TO FIRST EMBODIMENT

FIG.2 CONFIGURATION DIAGRAM OF DRIVE UNIT DU ACCORDING TO FIRST EMBODIMENT

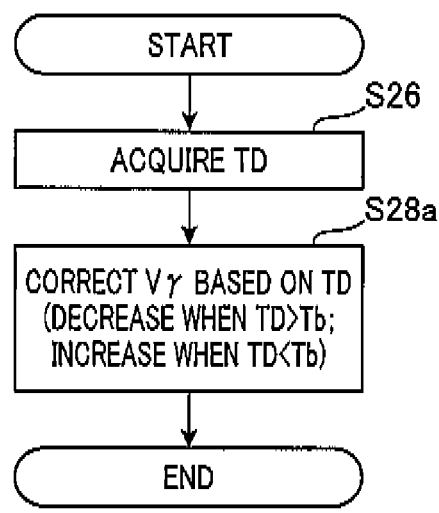

DRIVE UNIT FOR SWITCHING ELEMENT AND METHOD THEREOF

CROSS-REFERENCE TO RELATED APPLICATION

This application is based on and claims the benefit of priority from earlier Japanese Patent Application No. 2012-108126 filed May 10, 2012, the description of which is incorporated herein by reference.

BACKGROUND OF THE INVENTION

1. Field of the Invention

The present invention relates to a drive unit for a switching element having an excess current protection function that is capable of being applied to, for example, a rotating electrical machine.

2. Description of the Related Art

As shown, for example, in JP-B-3474775, as this type of device, a device is known that includes an excess current protection circuit that protects a switching element (such as an insulated-gate bipolar transistor [IGBT]) from excess current. Specifically, the device includes a resistor and a comparator. The resistor is connected between a sense terminal and an output terminal of the switching element. The comparator compares a sense voltage and a threshold voltage. The sense voltage is the difference of electric potential between both ends of the resistor. Here, the sense terminal is a terminal that outputs a minute current having correlation with a current flowing between the input and output terminals of the switching element.

In a configuration such as that described above, when a collector current becomes excessively large and the sense voltage is judged to exceed the threshold voltage, a judgment is made that excess current is flowing to the switching element. The switching element is then switched to an OFF state. As a result, the switching element is protected from the excess current. Decrease in the reliability of the switching element can be prevented.

However, the inventors of the present invention have come across the following issue. Even when excess current is flowing to the switching element, the flow of excess current to the switching element cannot be promptly detected because the actual sense voltage is lower than an initial assumed value based on the collector current. When the excess current cannot be promptly detected, the reliability of the switching element may decrease.

Therefore, regarding drive units for a switching element having an excess current protection function, a new drive unit for a switching element is desired that is capable of promptly detecting the flow of excess current.

SUMMARY

As a typical example, the present application provides a drive unit for a switching element including: a sense terminal output current detecting means for detecting an output current of a sense terminal that outputs a minute current having correlation with a current flowing between an input terminal and an output terminal of a switching element; a switching element drive control means for restricting the driving of the switching element when the output current detected by the sense terminal output current detecting means exceeds a predetermined threshold value; and a threshold changing means for changing the threshold value based on difference of electric potential between the input terminal and the output terminal of the switching element.

The inventors of the present invention have conducted keen investigation, experimentation, and the like regarding the factors involved in the actual output current of the sense terminal becoming lower than an initially assumed value based on the current flowing between the input terminal and the output terminal of the terminal, in a situation in which excess current is flowing to the switching element. The inventors have found the factor to be the difference of electric potential between the input terminal and the output terminal of the switching element. In light of this point, in the present application, a threshold changing means is provided. Based on the difference of electric potential, the threshold value for restricting the driving of the switching element when excess current is flowing to the switching element is changed. As a result, the flow of excess current to the switching element can be promptly detected. Furthermore, decrease in the reliability of the switching element can be prevented.

BRIEF DESCRIPTION OF THE DRAWINGS

FIG. 11 is a flowchart of procedures in a correction process according to a fourth embodiment.

DETAILED DESCRIPTION OF THE PREFERRED EMBODIMENTS

First Embodiment

A drive unit for a switching element according to a first embodiment of the present invention will be described with reference to the drawings. According to the first embodiment, the drive unit for a switching element is applied to a hybrid car providing both a motor as a main driving engine and an internal combustion engine (i.e. gasoline engine) as a supplemental driving engine.

Figure 1:
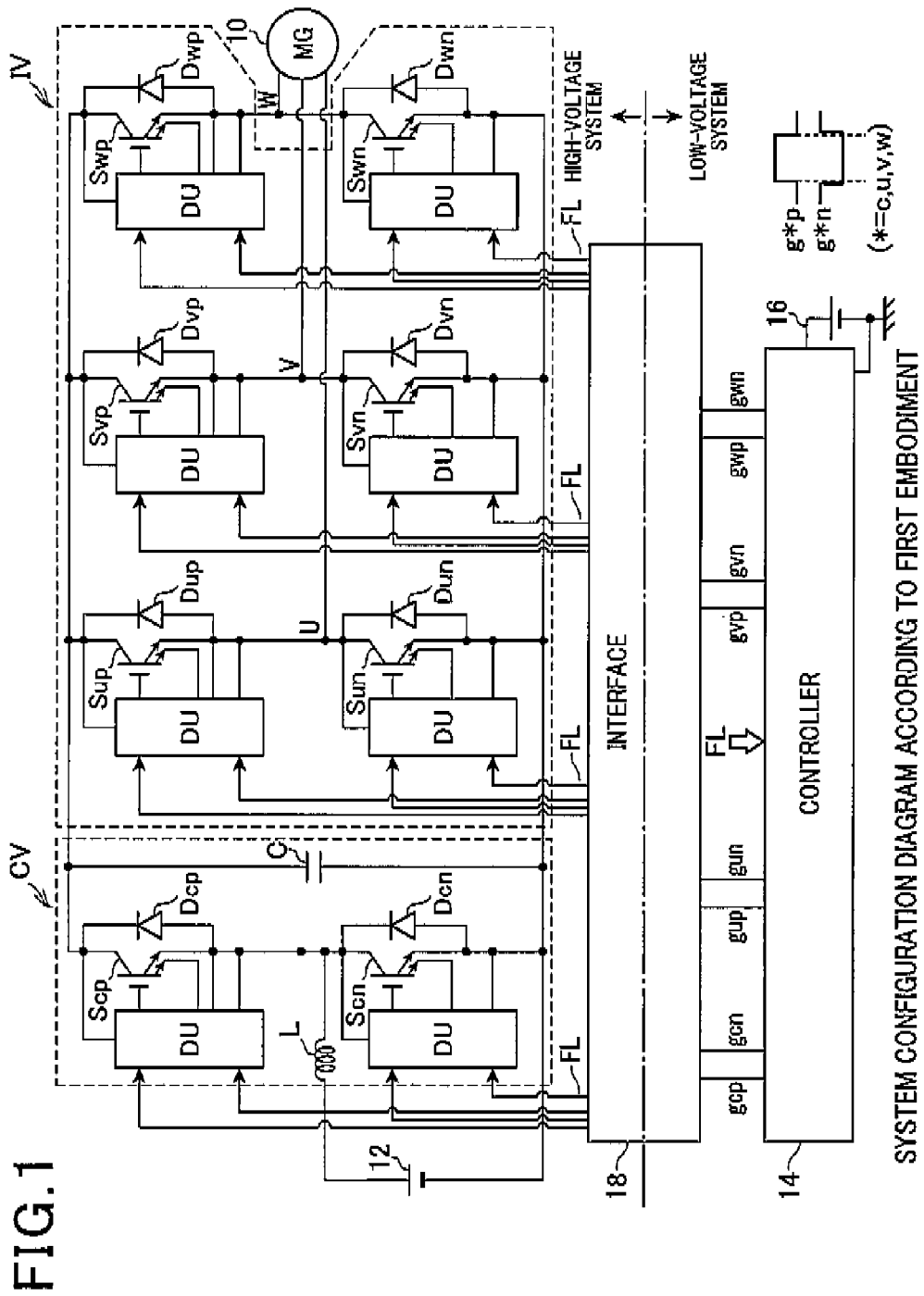
FIG. 1 is a system configuration diagram according to a first embodiment.

FIG. 1 shows an overall configuration of a system according to the first embodiment.

A motor generator (MG) 10 is configured to be capable of being set to two operating states: "power running mode" providing a function as a motor that is a cruising drive source and "electric power regenerating mode" providing a function as a power generator. The motor generator 10 receives electric power from a battery and is used as an electric motor, or is used as a power generator for charging the battery. These modes depend on the operating state required. According to the first embodiment, the motor generator 10 is a main driving engine of a hybrid car and is connected to a drive wheel (not shown). The motor generator 10 is connected to a high-voltage battery 12 with an inverter IV and a converter CV therebetween. The converter CV serves as a direct-current power source. Here, the converter CV includes a capacitor C, a pair of switching elements Scp and Scn, and a reactor L. The pair of switching elements Scp and Scn are connected in parallel with the capacitor C. The reactor L connects the connection point of the switching elements Scp and Scn and the positive terminal of the high-voltage battery 12. Specifically, the converter CV provides a function for increasing the voltage (such as 288 volts) of the high-voltage battery 12 with a predetermined voltage (such as 666 volts) set as an upper limit, by ON/OFF operations of the switching elements Scp and Scn.

On the other hand, the inverter IV includes a serially connected member composed of switching elements Sup and Sun, a serially connected member composed of switching elements Svp and Svn, and a serially connected member composed of switching elements Swp and Swn. The respective connection points of the serially connected members are respectively connected to the U-phase, V-phase, and W-phase of the motor generator 10.

According to the first embodiment, a voltage-regulating type switching element is used as the switching element S*# (*=c,u,v,w; #=p,n; the same applies hereafter). More specifically, an IGBT is used. In addition, a free-wheeling diode D*# is connected in inverse parallel to each switching element S*#. Furthermore, a temperature-sensitive diode SD that detects the temperature of the switching element S*# is provided near each switching element S*# (not shown). The temperature-sensitive diode SD will be described in detail hereafter.

A controller 14 operates the inverter IV and the converter CV to control controlled variables (such as torque) of the motor generator 10 as required, using a low-voltage battery 16 as a power source. Specifically, the controller 14 operates the switching elements Scp and Scn of the converter CV by outputting operating signals gcp and gcn to the drive units DU of the converter CV. In addition, the controller 14 operates the switching elements Sup, Sun, Svp, Svn, Swp, and Swn of the inverter IV by outputting operating signals gup, gun, gyp, gvn, gwp, and gwn to the drive units DU of the inverter IV. The operating signals gup, gun, gyp, gvn, gwp, and gwn are generated by known sine-wave pulse-width modulation control or the like. Here, the operating signals g*p (*=c,u,v,w) on the high potential side and the corresponding operating signals g*n (*=c,u,v,w) on the low potential side are mutually complementary signals. In other words, the switching elements S*p on the high potential side and the corresponding switching elements S*n on the low potential side are alternately set to the ON state.

An interface 18 is a device for performing transmission and reception of signals between a high-voltage system including the high-voltage battery 12 and a low-voltage system including the low-voltage battery 16, while insulating therebetween. The low-voltage battery 16 is a driving power supply of the controller 14. According to the first embodiment, a photocoupler is used as the interface 18.

Next, a configuration of the drive unit DU according to the first embodiment will be described with reference to FIG. 2.

Figure 2:
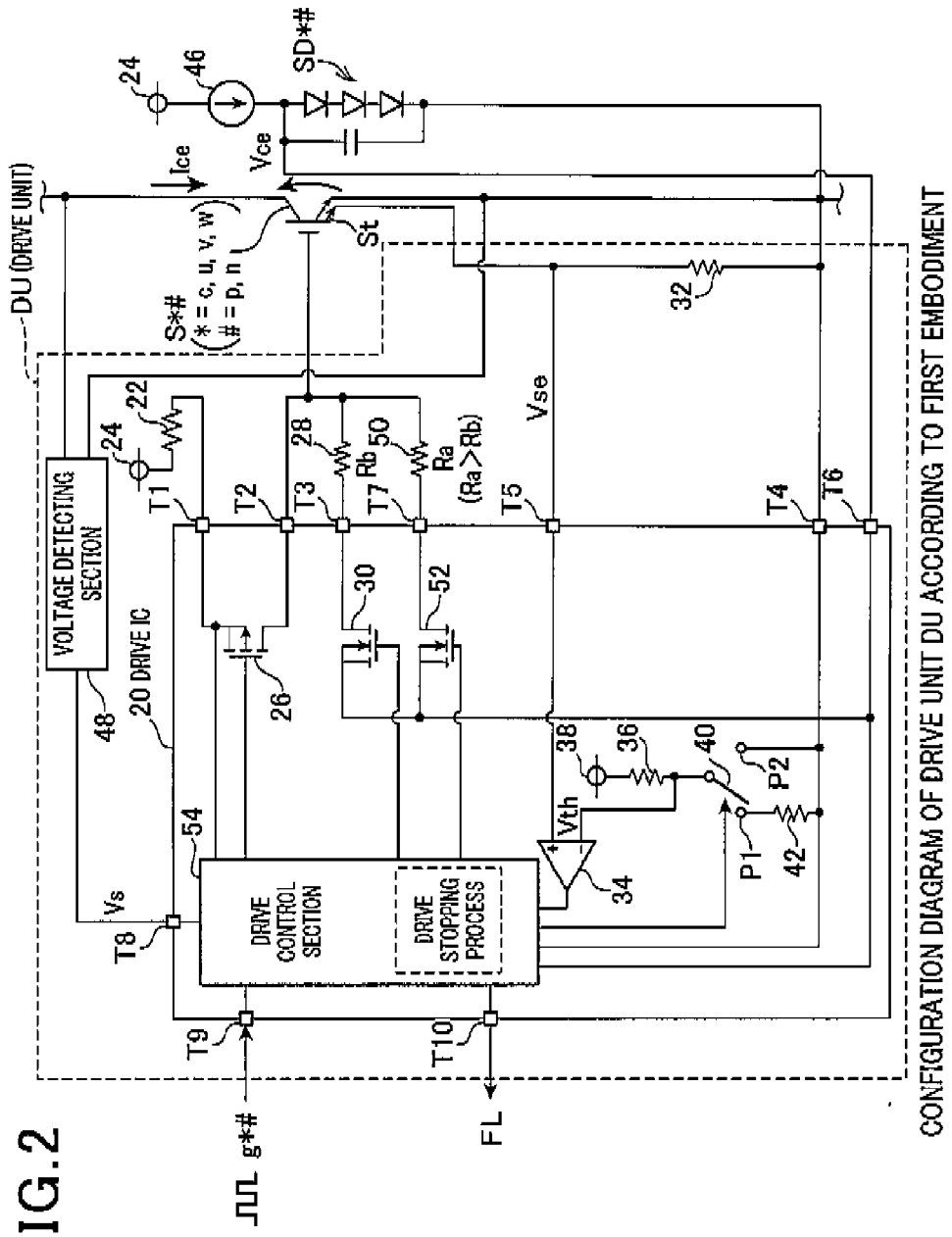
FIG. 2 is a configuration diagram of a drive unit according to the first embodiment.

As shown in FIG. 2, the drive unit DU includes a drive integrated circuit (IC) 20 that is a semiconductor integrated circuit configured as a single chip. A constant voltage power supply 24 is connected to a terminal T1 of the drive IC 20 with a charging resistor 22 therebetween. A terminal voltage of the constant voltage power supply 24 is a predetermined low voltage (such as 15V). The constant voltage power supply 24 provides a function for applying a voltage to an open/close control terminal (gate) of the switching element S*#. In FIG. 2, the above-described free-wheeling diode D*# is omitted.

The terminal T1 is connected to a terminal T2 of the drive IC 20 with a P-channel metal-oxide-semiconductor field-effect transistor (MOSFET) (charging switching element 26) therebetween. The terminal T2 is connected to the gate of the switching element S*#.

The gate of the switching element S*# is connected to a terminal T3 of the drive IC 20 with a discharging resistor 28 therebetween. The terminal T3 is connected to a terminal T4 of the drive IC 20 with an N-channel MOSFET (discharging switching element 30) therebetween. The terminal T4 is connected to an output terminal (emitter) of the switching element S*#.

The switching element S*# includes a sense terminal St. The sense terminal St outputs a minute current (such as "1/10000" of a collector current Ice) having correlation with a current flowing between its own input terminal (collector) and emitter (referred to, hereinafter, as collector current Ice). The sense terminal St is connected to the emitter of the switching element S*# with a resistor (sense resistor 32) therebetween. As a result, voltage drop occurs in the sense resistor 32 occurs by the minute current outputted from the sense terminal St. Therefore, the electric potential on the sense terminal St side (referred to, hereinafter, as sense voltage Vse) of the sense resistor 32 can be set to an electrical quantity of state correlated with the collector current Ice.

According to the first embodiment, the sense voltage Vse in an instance in which the electric potential on the sense terminal St side, of both ends of the sense resistor 32, is higher than the electric potential of the emitter is defined as being positive. The electric potential of the emitter is 0 (zero) volt.

Of both ends of the sense resistor 32, the sense terminal St side is connected to a non-inverting input terminal of a comparator 34 with a terminal T5 of the drive IC 20 therebetween. A constant voltage power supply 38 is connected to an inverting input terminal of the comparator 34 with a resistor 36 therebetween. Of both ends of the resistor 36, the side opposite to the constant voltage power supply 38 side can be connected to a connection point P1 or a connection point P2 by a switch 40. The connection point P1 is connected to the terminal T4 with a resistor 42 therebetween. The connection point P2 is directly connected to the terminal T4. Here, according to the first embodiment, the electric potential at the connection point of the resistor 36 and the switch 40 is referred to as a threshold voltage Vth. When one end of the resistor 36 and the connection point P1 are connected by operation of the switch 40, the threshold voltage Vth becomes a voltage that is the terminal voltage of the constant voltage power supply 38 divided by the resistors 36 and 42. On the other hand, when one end of the resistor 36 and the connection point P2 are connected by operation of the switch 40, the threshold voltage Vth is 0 (zero) volt.

The temperature-sensitive diode SD*# for detecting the temperature of the switching element S*# (referred to, hereinafter, as element temperature) is provided near the switching element S*#. The temperature-sensitive diode SD*# is supplied electric charge from a constant voltage power supply 44 via a constant current source 46. The constant voltage power supply 44 is externally attached to the drive IC 20. A cathode of the temperature-sensitive diode SD*# is connected to the emitter of the switching element S*#. An anode of the temperature-sensitive diode SD*# is connected to a terminal T6 of the drive IC 20. According to a configuration such as this, the temperature-sensitive diode SD*# outputs a voltage based on the temperature of the switching element S*#.

A voltage detecting section 48 provides a function for detecting a collector-emitter voltage Vce of the switching element S*#. According to the first embodiment, a component capable of detecting the collector-emitter voltage Vce while providing insulation between a flow-path side of the collector current Ice and the drive unit DU side of the switching element S*# is used as the voltage detecting section 48.

The gate of the switching element S*# is further connected to the terminal T4 with a soft cutting-off resistor 50, a terminal T7 of the drive IC 20, and an N-channel MOSFET (soft cutting-off switching element 52) therebetween.

Output signals from the comparator 34, an output voltage from the temperature-sensitive diode SD*#, and the collector-emitter voltage detected by the voltage detecting section 48 are inputted into a drive control section 54. Specifically, the drive control section 54 detects an element temperature TD based on the output voltage of the temperature-sensitive diode SD*# inputted via the terminal T6, detects the collector-emitter voltage via the terminal T8, and operates the switch 40.

Next, a charging/discharging process for gate charge and excess current protection process are performed by the drive control section 54.

First, the charging/discharging process for gate charge will be described.

According to the first embodiment, the drive control section 54 performs the charging process by performing constant current control. Specifically, the drive control section 54 performs the constant current control by controlling the gate voltage of the charging switching element 26 such that a voltage drop quantity of the charging resistor 22 becomes a target value (such as 1V) thereof, as a result of the operating signal g*# inputted via the terminal T9 of the drive IC 20 being an ON-operation instruction. As a result, a charging current of the gate of the switching element S*# is controlled to a constant value, thereby suppressing a surge voltage that is generated when the switching element S*# is switched to an ON state. During the period in which the charging process is performed, the discharging switching element 30 is set to an OFF state.

On the other hand, the discharging process of the gate is performed as follows. The drive control section 54 sets the discharging resistor 28 to an ON state and the charging switching element 26 to an OFF state as a result of the operating signal g*# being an OFF-operation instruction. As a result, the switching element S+# is switched to the OFF state.

Next, the excess current protection process will be described. The drive control section 54 performs the excess current protection process by performing an ON operation of the soft cutting-off switching element 53 and running a soft cut-off function to forcibly set the switching element S*# to the OFF state, when judged that the logic of the output signal of the comparator 34 is "H" over a predetermined amount of time (such as several microseconds). According to the first embodiment, the switch 40 is basically operated to connect the resistor 36 and the connection point P1. The resistance values of the resistors 36 and 42 are set such that a value slightly smaller than the sense voltage Vse corresponding to an instance in which excess current is flowing to the switching element S*# becomes the threshold voltage Vth.

According to the excess current protection process, when the time over which the excess current flows to the switching element S*# continues for a predetermined amount of time, the soft cutting-off switching element 52 is set to the ON state and the gate charge is discharged. As a result, the switching element S*# is forcibly set to the OFF state. Here, the soft cutting-off resistor 50 is used to set the resistance value of the discharge path of the gate charge to high resistance. More specifically, a resistance value Ra of the soft cutting-off resistor 50 is set to be higher than a resistance value Rb of the discharging resistor 28. This setting is made in light of the risk of surge voltage becoming excessively large when the speed at which the switching element S*# is switched from the ON state to the OFF state, or in other words, the cut-off speed between the collector and the emitter, is high, in a situation in which the collector current Ice is excessively large.

When performing the excess current protection process, the drive control section 54 performs a process for outputting a fail signal FL together with a drive stopping process to stop driving the charging switching element 26 and the discharging switching element 30. The fail signal FL is outputted to the low-voltage system via a terminal T10 of the drive IC 20 and the interface 18. Various types of fail-safe management are performed using the fail signal FL.

The inventors of the present invention have come across a following issue. In an instance in which the collector-emitter voltage Vce when the switching element S*# is set to the OFF state is low as a result of the input voltage of the inverter IV being excessively low, even should excess current subsequently flow to the switching element S*#, the excess current cannot be promptly detected. Here, a situation in which the input voltage of the inverter IV is excessively low is, for example, an abnormal situation in which the input voltage falls below a lower limit value of an input voltage range assumed for ordinary use of the inverter IV. This issue will be described hereafter with reference to FIG. 3 and FIG. 4.

Figure 3:
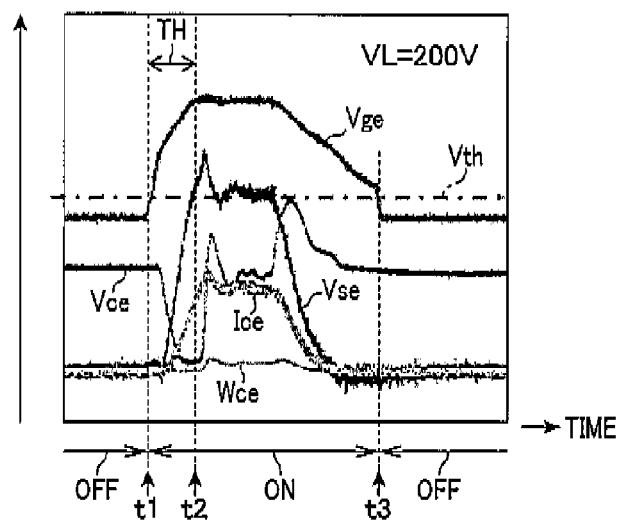
FIG. 3 is a diagram of measurement results of transitions in sense voltage and the like during flow of excess current according to the first embodiment.
Figure 4:
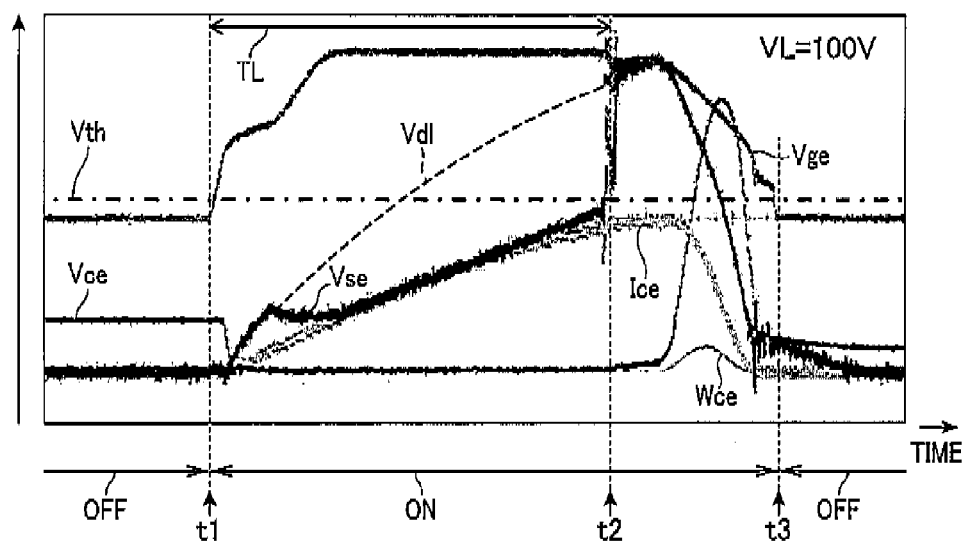
FIG. 4 is a diagram of measurement results of transitions in sense voltage and the like during flow of excess current according to the first embodiment.

FIG. 3 and FIG. 4 show the transitions in the gate voltage Vge, the sense voltage Vse, the collector-emitter voltage Vce, the collector current Ice of the switching element S*#, and the loss in the switching element S*# (a multiplied value of the collector-emitter voltage Vce and the collector current Ice) when excess current flows to the switching element S*#. Specifically, FIG. 3 shows the transitions when the collector-emitter voltage Vce is high (the input voltage VL of the inverter IV is 200V). Hg. 4 shows the transitions when the collector-emitter voltage Vce is low (the input voltage VL of the inverter IV is 100V). In FIG. 3 and FIG. 4, the horizontal axis scales (time scales) are the same, and the vertical axis scales (voltage scales and the like) are the same.

As shown in FIG. 3 and FIG. 4, in comparison to when the collector-emitter voltage Vce is high, when the collector-emitter voltage Vce is low, the amount of time from a timing at which the ON operation of the switching element S*# is started (time t1) to a timing at which the sense voltage Vse reaches the threshold voltage Vth (time t2) is long (TH<TL). A reason for this is that, the lower the collector-emitter voltage Vce when the switching element S*# is in the OFF state is, the lower the actual sense voltage Vce in an instance in which the driving state of the switching element S*# is a transient state is than an initial assumed value Vdl based on the collector current Ice, as shown in FIG. 4. In other words, after the ON operation of the switching element S*# is started, the sense voltage Vse basically increases based on the increase in the collector current Ice. However, the lower the collector-emitter voltage Vce when the switching element S*# is OFF is, the lower the speed of increase of the sense voltage Vse is than the initial assumed value.

When the amount of time until the sense voltage Vse reaches the threshold voltage Vth becomes long, a subsequent current cut-off timing (time 3) at which the soft cutting-off function is run is delayed. Therefore, the amount of time during which the excess current flows to the switching element S*# becomes long. As a result, loss in the switching element S*# increases. In addition, the surge voltage when the switching element S*# is OFF, caused by the collector current Ice at start-up of the soft cutting-off function, becomes high (refer to the collector-emitter voltage Vce during time t2 to time t3 in FIG. 4). As a result, the reliability of the switching element S*# may decrease.

As a measure against such issues, according to the first embodiment, a threshold voltage changing process, described hereafter, is performed. As a result, decrease in the reliability of the switching element S*# can be prevented.

Figure 5:
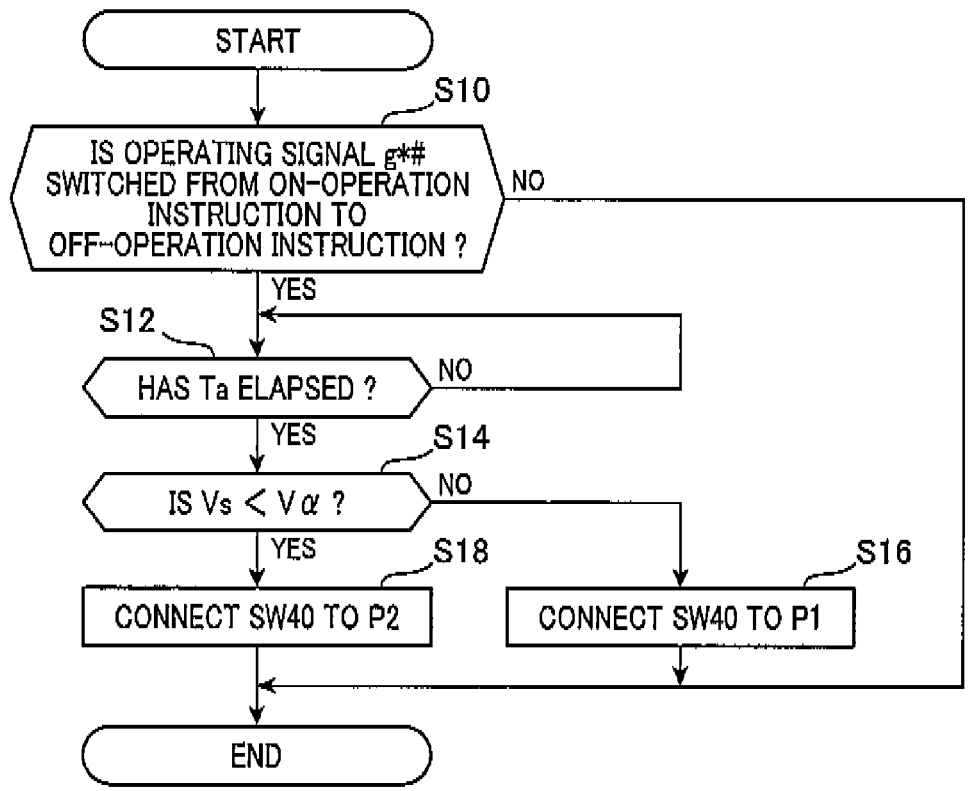
FIG. 5 is a flowchart of procedures in a threshold voltage changing process according to the first embodiment.

FIG. 5 shows the procedures in the threshold voltage changing process performed by the drive control section 54. The drive control section 54 according to the first embodiment is hardware. Therefore, the process shown in FIG. 5 is performed in actuality by a logic circuit.

In the series of processing operations, first, at Step S10, the drive control section 54 judges whether or not the operating signal g*# is switched from the ON-operation instruction to the OFF-operation instruction.

When judged "YES" at Step S10, the drive control section 54 proceeds to Step S12 and waits until a first prescribed time period Ta has elapsed from the switch to the OFF-operation instruction. Here, the first prescribed time period Ta is merely required to be set from the perspective of accurately recognizing whether or not there is risk of delay in the detection of excess current. Specifically, for example, the first prescribed time period Ta is merely required to be set to a period during which the operating signal g*# is the OFF-operation instruction, and during which the collector-emitter voltage at a timing at which the collector-emitter voltage Vce does not change can be used in the processing operation at Step S14, described hereafter.

At subsequent Step S14, the drive control section 54 judges whether or not the collector-emitter voltage Vs detected by the voltage no detecting section 48 is less than a first prescribed voltage Vα. The drive control section 54 performs the processing operation to judge whether or not the actual sense voltage Vse is lower than the initial assumed value based on the collector current Ice, in an instance in which the subsequent driving state of the switching element S*# is a transient state transitioning from the OFF state to the ON state. In other words, the drive control section 54 performs the processing operation to judge whether or not there is risk of delay in the detection of excess current in the switching element S*#.

The first prescribed voltage Vα is merely required to be set, for example, based on experiments or the like in advance, from the perspective of preventing a situation in which the reliability of the switching element S*# decreases as a result of delay in the detection of excess current.

When judged "NO" at Step S14, the drive control section 54 judges that there is no risk of delay in the detection of excess current and proceeds to Step S16. At Step S16, the drive control section 54 operates the switch 40 to connect one end of the resistor 36 and the connection point P1.

On the other hand, when judged "YES" at Step S14, the drive control section 54 judges that there is risk of delay in the detection of excess current and proceeds to Step S18. At Step S18, the drive control section 54 operates the switch 40 to connect one end of the resistor 36 and the connection point P2. As a result, the threshold voltage Vth is set to the emitter potential (0V). In other words, the threshold voltage Vth is changed in a direction in which driving of the switching element S*# is restricted. As a result of the threshold voltage Vth being changed in this way, even when the operating signal g*# is subsequently switched to the ON-operation instruction, the driving of the switching element S*# (switching to the ON state) is stopped by a drive stopping process.

Even when the driving of the switching element S*# is temporarily restricted, the drive stopping process may be cancelled when the collector-emitter voltage Vs when the switching element S*# is subsequently set to the OFF state is judged to be the prescribed voltage Vα or higher.

When judged "NO" at above-described Step S10 or when the processing operations at Step S16 and Step S18 are completed, the series of processing operations are temporarily ended.

As described above, according to the first embodiment, when the collector-emitter voltage Vs when the switching element S*# is in the OFF state is judged to be less than the first prescribed voltage Vα, the threshold voltage Vth is changed to "0". In this configuration, an opportunity to change the threshold voltage Vth is provided at each ON/OFF cycle of the switching element S*#. A situation in which the detection of excess current becomes delayed can be promptly recognized.

In addition, because the drive stopping process is performed, the driving of the switching element S*# can be stopped in a situation in which the detection of excess current may be delayed. Decrease in the reliability of the switching element S*# can be favorably prevented.

Second Embodiment

A second embodiment will hereinafter be described with reference to the drawings, focusing on the differences with the above-described first embodiment.

According to the second embodiment, as the threshold voltage changing process, a process is performed in which the threshold voltage Vth is changed based on the collector-emitter voltage Vs when the switching element S*# is set to the ON state. The process is performed in light of the judgment regarding whether or not there is risk of delay in the detection of excess current being possible based on the collector-emitter voltage Vs when the switching element S*# is set to the ON state, as well.

Here, the reason that the judgment regarding whether or not there is risk of delay in the detection of excess current is possible will be described. The sense voltage Vse does not reach a voltage equal to or higher than the collector-emitter voltage Vce of when the switching element S*# is in the ON state. This is because a voltage drop quantity on a path from the emitter to the collector via a collector current flow section (main cell section) of the switching element S*# and a voltage drop quantity on a path from the emitter to the collector via the sense resistor 32 and the sense terminal St (sense cell section) are the same.

Therefore, the lower the collector-emitter voltage Vce when the switching element S*# is in the ON state is, the lower the actual sense voltage Vse in an instance in which the driving state of the switching element S*# is the transient state in a situation in which excess current is flowing may become than the initial assumed value based on the collector current Ice. In other words, whether or not there is risk of delay in the detection of excess current can be judged based on the collector-emitter voltage Vce when the switching element S*# is in the ON state.

As a situation in which the collector-emitter voltage Vce when the switching element S*# is in the ON state becomes low, for example, a situation can be given in which the switching element S*# is in the ON state when interphase short-circuiting occurs. Hereafter, interphase short-circuiting will be described with reference to FIG. 6.

Figure 6:
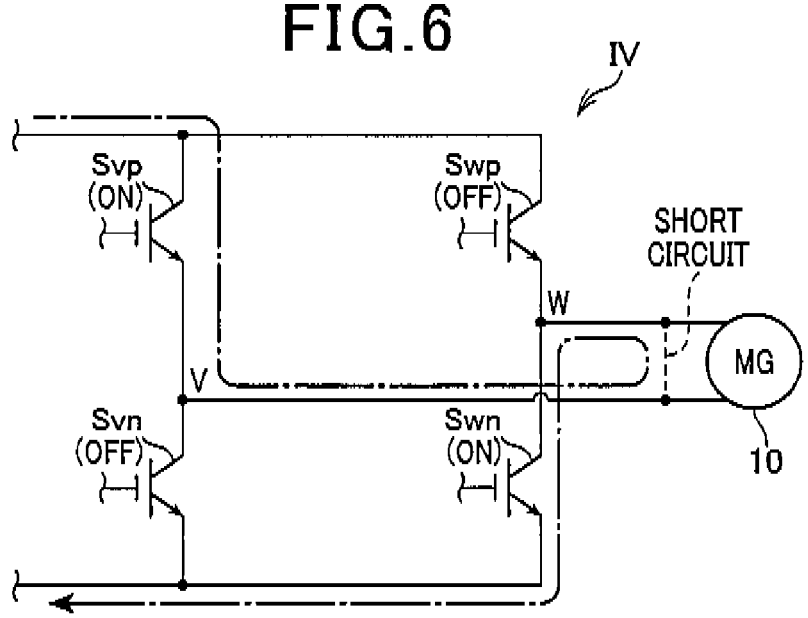
FIG. 6 is a diagram of an overview of interphase short-circuiting according to a second embodiment.

FIG. 6 is a diagram of the V-phase and W-phase arm sections of the inverter IV and the motor generator 10 among the overall configuration of the system shown in above-described FIG. 1.

Interphase short-circuiting refers to the following. In a situation in which two among the electrical paths (such as bus bars) of the three phases connecting the inverter IV and the motor generator 10 are short-circuited or connecting sections of the electrical paths in the motor generator 10 are short-circuited, the switching element S¥p (¥=u,v,w) on the high-potential side and the switching element S¥n on the low-potential side corresponding with the short-circuited phases are in the ON state. In FIG. 6, as an example of interphase short-circuiting, an instance is shown in which the switching element Svp on the high-potential side of the V phase and the switching element Swn on the low-potential side of the W phase are set to the ON state in a situation in which the electrical paths of the V phase and the W phase are short-circuited.

Figure 7:
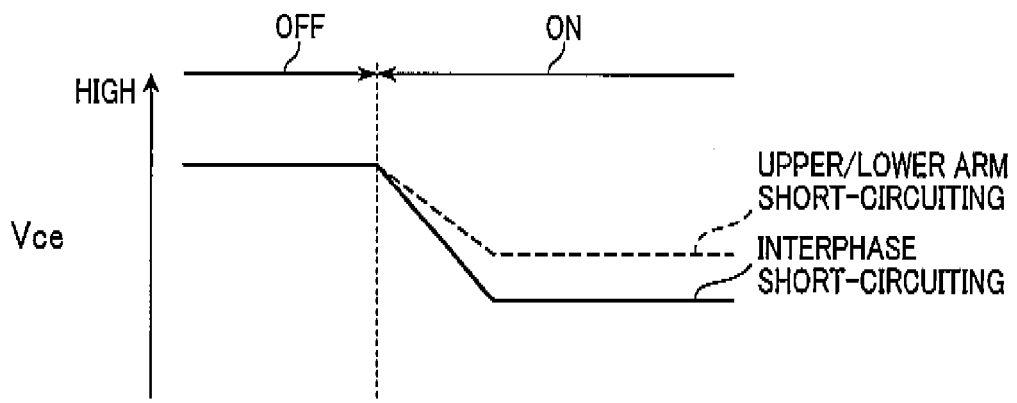
FIG. 7 is a diagram of transitions in collector-emitter voltage during interphase short-circuiting according to the second embodiment.

For example, in comparison to an instance in which upper/lower arm short-circuiting occurs, when interphase short-circuiting occurs, the collector-emitter voltage Vce when the switching element S¥# is in the ON state becomes low (see FIG. 7). Upper/lower arm short-circuiting is an instance in which, in a situation in which a short-circuit failure occurs in either of the high-potential side switching element S¥p and the low-potential side switching element S¥n, the other is in the ON state. The collector-emitter voltage Vce becomes low because, in comparison to when upper/lower arm short-circuiting occurs, the proportion of the resistance value of the path (such as the bus bar) from the emitter of the high-potential side switching element S¥p to the collector of the low-potential side switching element S¥n in relation to the resistance value of the flow path of the short-circuit current when interphase short-circuiting occurs is greater Here, the proportion becomes greater mainly because the flow path of the short-circuit current when interphase short-circuiting occurs is longer than the flow path of the short-circuit current when upper/lower arm short-circuiting occurs.

Regarding the switching elements Scp and Scn provided in the converter CV as well, when a situation occurs in which the collector-emitter voltage Vce when the switching element S*# is in the ON state is low in a manner similar to that when interphase short-circuiting occurs, whether or not there is risk of delay in the detection of excess current can be judged based on the collector-emitter voltage Vs.

Figure 8:
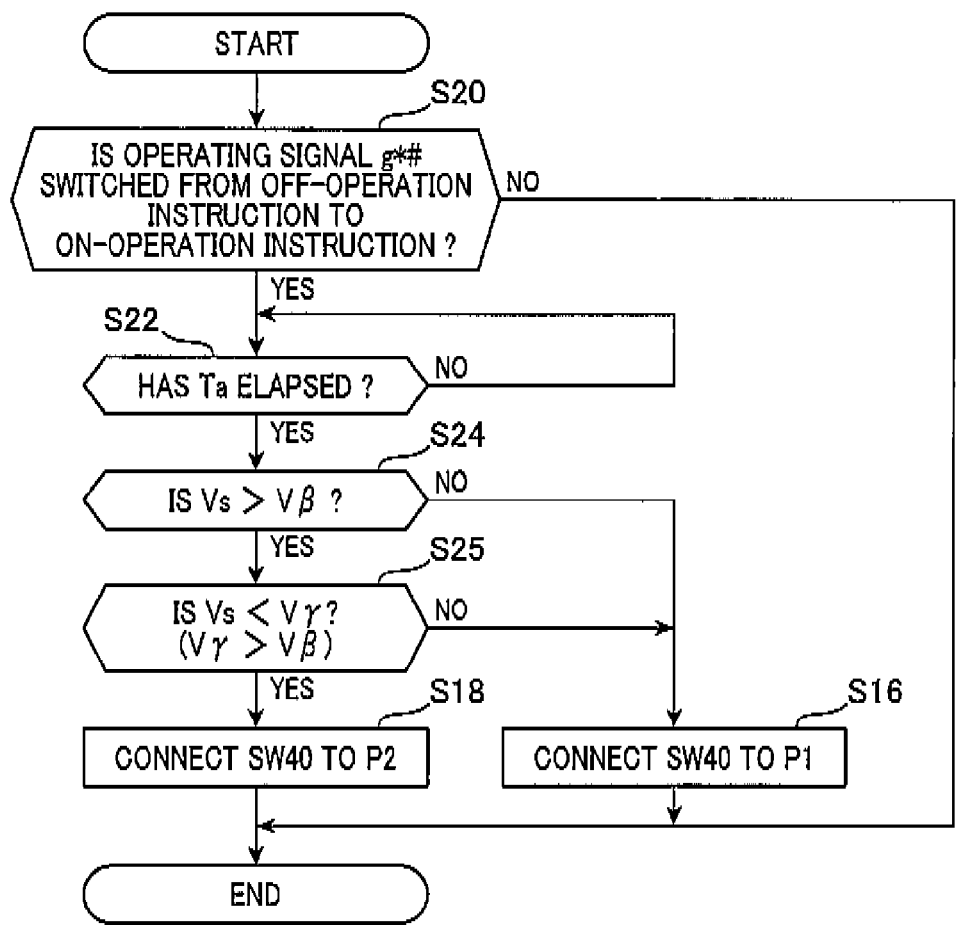
FIG. 8 is a flowchart of procedures in a threshold voltage changing process according to the second embodiment.

FIG. 8 shows the procedures in the threshold voltage changing process according to the second embodiment, performed by the drive control section 54. The drive control section 54 is hardware. Therefore, the process shown in FIG. 8 is in actuality performed by a logic circuit. In addition, processing operations in FIG. 8 that are shown in FIG. 5 are given the same reference numbers for convenience.

In the series of processing operations, first, at Step S20, the drive control section 54 judges whether or not the operating signal g*# is switched from the OFF-operating instruction to the ON-operating instruction.

When judged "YES" at Step S20, the drive control section 54 proceeds to Step S22 and waits until a second prescribed time period Tb has elapsed from the switch to the ON-operation instruction. Here, the second prescribed time period Tb is merely required to be set from the perspective of accurately recognizing whether or not there is risk of delay in the detection of excess current and shortening the amount of time over which excess current flows to the switching element S*#. Specifically, for example, the second prescribed time period Tb is merely required to be set to a period during which the collector-emitter voltage at a timing immediately after the operating signal g*# is switched to the ON-operation instruction (such as a timing near time t2 in above-described FIG. 3) can be used in the processing operations at Step S24 and Step S25, described hereafter.

At subsequent Step S24, the drive control section 54 judges whether or not the collector-emitter voltage Vs detected by the voltage detecting section 48 exceeds a second prescribed voltage Vβ. Here, the second prescribed voltage Vβ is merely required to be set to a value enabling judgment regarding whether or not excess current is flowing to the switching element S*#. Specifically, for example, the second prescribed voltage Vβ is merely required to be set to the collector-emitter voltage Vce corresponding to an upper limit value of the collector current Ice in a normal state in which excess current is not flowing to the switching element S*# (in other words, the upper limit value of the collector current Ice when the switching element S*# is in the ON state in a situation in which neither upper/lower arm short-circuiting nor interphase short-circuiting occurs).

When judged "YES" at Step S24, the drive control section 54 judges that excess current is flowing and proceeds to Step S25. At Step S25, the drive control section 54 judges whether or not the collector-emitter voltage Vs is less than a third prescribed voltage Vγ that is higher than the second prescribed voltage Vβ. The drive control section 54 performs the processing operation to judge whether or not there is risk of delay in the detection of excess current in the switching element S*#. Here, the third prescribed voltage Vγ is merely required to be set, for example, based on experiments or the like in advance, from the perspective of recognizing a situation in which the sense voltage Vse is restricted by the collector-emitter voltage Vce regardless of the flow of excess current (such as a situation in which interphase short-circuiting occurs).

When judged "NO" at Step S24 and Step S25, the drive control section 54 proceeds to Step S16. On the other hand, when judged "YES" at Step S25, the drive control section 54 proceeds to Step S18.

When judged "NO" at Step S20 or when the processing operations at Step S16 and Step S18 are completed, the series of processing operations are temporarily ended.

In the threshold voltage changing process according to the second embodiment described above, the driving of the switching element S*# can be promptly stopped when a judgment is made that there is risk of delay in the detection of excess current immediately after the operating signal g*# is switched to the ON-operation instruction.

Third Embodiment

A third embodiment will hereinafter be described with reference to the drawings, focusing on the differences with the above-described second embodiment.

Figure 9:
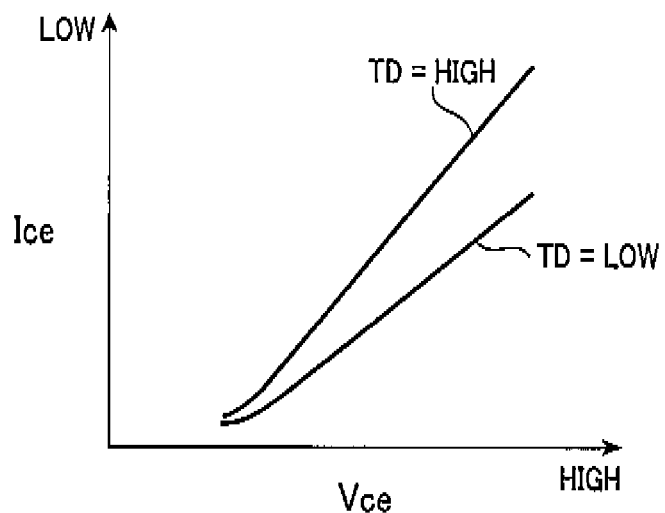
FIG. 9 is a diagram of temperature dependency of collector-emitter voltage according to a third embodiment.

According to the third embodiment, the collector-emitter voltage Vs used in the threshold voltage changing process is corrected based on the element temperature TD calculated from the output voltage of the temperature-sensitive diode SD*#. This process is performed based on the tendency for the collector-emitter voltage Vce when the switching element S*# is in the ON state to ordinarily become lower, the higher the element temperature TD is, in relation to the same collector current Ice, as shown in FIG. 9.

Figure 10:
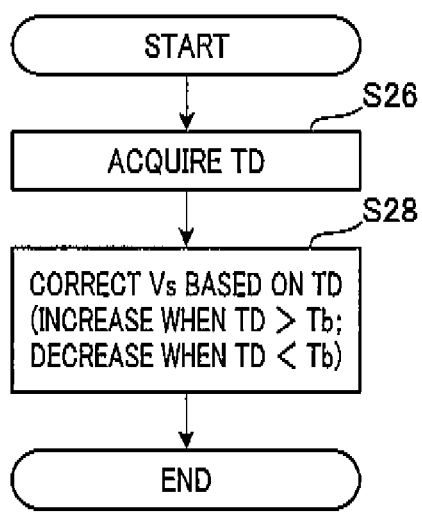
FIG. 10 is a flowchart of procedures in a correction process according to the third embodiment.

FIG. 10 shows the procedures in the correction process performed by the drive control section 54. The drive control section 54 is hardware. Therefore, the process shown in FIG. 10 is in actuality performed by a logic circuit.

In the series of processing operations, first, at Step S26, the drive control section 54 acquires the element temperature TD. Here, the timing at which the element temperature TD is acquired may be, for example, a timing immediately after the switching element S*# is set to the ON state (such as a timing near time t2 in above-described FIG. 3).

At subsequent Step S28, the drive control section 54 corrects the collector-emitter voltage Vs acquired when the switching element S*# is in the ON state based on the acquired element temperature TD. According to the third embodiment, when the element temperature TD is higher than a reference temperature Tb (a value set in advance, such as 25° C.), the collector-emitter voltage Vs is corrected such as to be increased. When the element temperature TD is lower than the reference temperature Tb, the collector-emitter voltage Vs is corrected such as to be decreased.

When the processing operation at Step S28 is completed, the series of processing operations are temporarily ended. The corrected collector-emitter voltage Vs is used in the above-described processing operations at Step S24 and Step S25 in FIG. 8.

In the correction process described above, the effect of variations in the collector-emitter voltage Vs attributed to the element temperature TD on the judgment regarding delay in excess current detection can be reduced. In other words, the accuracy of judgment regarding whether or not the detection of excess current is delayed can be increased.

Fourth Embodiment

A fourth embodiment will hereinafter be described with reference to the drawings, focusing on the differences with the above-described third embodiment.

According to the fourth embodiment, the method of reducing the effect of variations in the collector-emitter voltage Vs attributed to the element temperature TD on the judgment regarding delay in excess current detection is changed. Specifically, the third prescribed voltage Vγ used in the threshold voltage changing process is corrected based on the element temperature TD.

FIG. 11 shows the procedures in the correction process performed by the drive control section 54. The drive control section 54 is hardware. Therefore, the process shown in FIG. 11 is in actuality performed by a logic circuit. In addition, processing operations in FIG. 11 that are shown in FIG. 10 are given the same reference numbers for convenience.

In the series of processing operations, at Step S28a, the drive control section 54 corrects the third prescribed voltage Vγ based on the element temperature TD. According to the fourth embodiment, when the element temperature TD is higher than the reference temperature Tb, the third prescribed voltage Vγ is corrected such as to be decreased. When the element temperature TD is lower than the reference temperature Tb, the third prescribed voltage Vγ is corrected such as to be increased.

When the processing operation at Step S28a is completed, the series of processing operations are temporarily ended.

In the correction process described above as well, the accuracy of judgment regarding whether or not the detection of excess current is delayed can be increased.

Variation Examples

Each of the above-described embodiments may be modified as follows.

The circuit configuration for changing the threshold voltage Vth is not limited to that of the example according to the first embodiment. For example, the circuit may be configured to include two power supplies having differing output potentials and a switch capable of connecting one of the two power supplies and the non-inverting input terminal of the comparator 34. The threshold voltage Vth can be changed by operation of the switch. In addition, for example, the circuit may be configured to include a power supply capable of changing the voltage applied to the inverting input terminal of the comparator 34. The threshold voltage Vth can be changed by the output potential of the power supply being changed.

The method of setting the threshold voltage Vth is not limited to that of the example according to the first embodiment. For example, the connection point P2 may be connected to a component having a lower electric potential than the emitter potential, instead of the emitter. A positive threshold voltage and a negative threshold voltage may be set as two threshold voltages Vth. In addition, for example, the connection point P2 and the terminal T4 may be connected by a resistor having a lower resistance value than the resistor 42. Two differing values higher than 0 (zero) volt may be set as the two threshold voltages Vth. Here, the resistance value of the resistor connected to the connection point P2 may be set such that the threshold voltage Vth when the connection point P2 and one end of the resistor 36 are connected by operation of the switch 40 is a value lower than the sense voltage Vse when the switching element S*# is in the OFF state.

Furthermore, the method of setting the threshold voltage Vth is not limited to that in which the threshold voltage Vth is changed in a binarized manner. For example, the threshold voltage Vth may be set in N-number of stages or more (N being an integer of value 3 or more). This method can be actualized, for example, by a configuration in which one end of each of three or more resistors having differing resistance values is connected to the terminal T4, and any of the resistors and one end of the resistor 36 can be selectively connected by the switch 40 being switched, in above-described FIG. 2.

Moreover, the method of setting the threshold voltage Vth is not limited to that in which the threshold voltage Vth is set in stages. The threshold voltage Vth may be set continuously. This method can be actualized by a power supply being provided that is capable of changing the voltage applied to the inverting input terminal of the comparator 34, in above-described FIG. 2. In this instance, according to the first embodiment, for example, the lower the collector-emitter voltage Vs when the switching element S*# is in the OFF state is, the lower the threshold voltage Vth can be set.

The switching element drive control means is not limited to that in which the driving of the switching element S*# is stopped on the high-voltage system side. For example, when judged "YES" at Step S14 in above-described FIG. 5, the judgment may be transmitted to the controller 14. The controller 14 may perform a shut-down process to forcibly change the operating signal g*# to the OFF-operation instruction. As a result, the driving of the switching element S*# can be stopped.

In addition, the switching element drive control means is not limited to that in which the driving of the switching element S*# is stopped. For example, the collector current may be decreased by the gate voltage being set to be lower than that in a normal state, while allowing the switching element S*# to be driven.

According to the above-described third embodiment and fourth embodiment, either of the collector-emitter voltage Vs and the third prescribed voltage Vγ is corrected based on the element temperature TD. However, this is not limited thereto. Both the collector-emitter voltage Vs and the third prescribed voltage Vγ may be corrected. In this instance, the correction amounts of the collector-emitter voltage Vs and the third prescribed voltage Vγ are set to be smaller than the correction amount in the instance in which either of the collector-emitter voltage Vs and the third prescribed voltage Vγ is corrected.

The direct-current power source in which the serially connected members composed of the high-potential side switching element S*p and the low-potential side switching element S*n are connected in parallel is not limited to the converter CV. For example, when the converter CV cannot be provided or when operation of the converter CV is stopped in the invention according to the first embodiment, the high-voltage battery 12 may serve as the direct-current power source.

The current detecting means is not limited to that including the sense resistor 32 that detects the current outputted from the sense terminal St as the sense voltage Vse. Other current detecting means may be used, such as that including a Hall element.

The means for detecting the temperature of the switching element is not limited to the temperature-sensitive diode. For example, a thermistor or a resistance temperature detector may be used.

The switching element S*# is not limited to the IGBT. For example, a MOSFET may be used.

Application of the invention of the present application is not limited to a power conversion circuit for driving a main driving engine mounted in a hybrid car. For example, the present invention may be applied to a power conversion circuit for driving a compressor for air-conditioning. Furthermore, application of the present invention is not limited to the power conversion circuits of converters, inverters, and the like.

What is claimed is:

1. A drive unit for a switching element, comprising:
   a sense terminal output current detecting means for detecting an output current of a sense terminal that outputs a minute current having correlation with a current flowing between an input terminal and an output terminal of a switching element;
   a switching element drive control means for restricting the driving of the switching element when the output current detected by the sense terminal output current detecting means exceeds a predetermined threshold value Vth; and
   a threshold changing means for changing the threshold value on the basis of a difference of electric potential between the input terminal and the output terminal of the switching element.

2. The drive unit for a switching element according to claim 1, wherein
   the threshold changing means changes the threshold value on the basis of a difference of electric potential between the input terminal and the output terminal of the switching element which is in an OFF state.

3. The drive unit for a switching element according to claim 2, wherein
   the threshold changing means changes the threshold value when the difference of electric potential between the input terminal and the output terminal of the switching element which is in an OFF state has become less than a first prescribed voltage Vα such that the drive of the switching element is restricted by the switching element drive control means.

4. The drive unit for a switching element according to claim 3, wherein
   the threshold changing means changes the threshold value when the difference of electric potential between the input terminal and the output terminal of the switching element which is in an OFF state has become less than said first prescribed voltage Vα so as to change the threshold value to less than a value of an output current of the sense terminal which is in the OFF state; and
   the switching element drive control means suspends the drive of the switching element when a value of the output current has become more than said changed threshold value.

5. The drive unit for a switching element according to claim 1, wherein
   the threshold changing means changes the threshold value on the basis of a difference of electric potential between the input terminal and the output terminal of the switching element which is in an ON state.

6. The drive unit for a switching element according to claim 5, wherein
   the threshold changing means changes the threshold value when the difference of electric potential between the input terminal and the output terminal of the switching element which is in an ON state has become less than a second prescribed voltage Vγ such that the drive of the switching element is restricted by the switching element drive control means.

7. The drive unit for a switching element according to claim 6, wherein
   the threshold changing means changes the threshold value when the difference of electric potential between the input terminal and the output terminal of the switching element which is in an ON state has become less than said second prescribed voltage Vγ so as to change the threshold value to less than a value of an output current of the sense terminal which is in an OFF state; and
   the switching element drive control means suspends the drive of the switching element when a value of the output current has become more than said changed threshold value.

8. The drive unit for a switching element according to claim 7, wherein
   the drive unit further includes a correction means that corrects, on the basis of a temperature of the switching element, at least one of i) a difference of electric potential between the input terminal and the output terminal of the switching element for changing a threshold value, or ii) said second prescribed voltage Vγ.

9. The drive unit for a switching element according to claim 8, wherein the switching element is disposed on an inverter which gives and receives an electric power to and from a rotating electrical machine.

10. The drive unit for a switching element according to claim 1, wherein the switching element includes a collector and an emitter and the threshold value is changed by the threshold changing means so that the threshold value is set to a potential of the emitter.

11. A driving method for a switching element, comprising steps of:
   detecting an output current of a sense terminal that outputs a minute current having correlation with a current flowing between an input terminal and an output terminal of a switching element;
   restricting the driving of the switching element when the output current detected by the sense terminal output current detecting means exceeds a predetermined threshold value Vth; and
   changing the threshold value on the basis of a difference of electric potential between the input terminal and the output terminal of the switching element.

12. The driving method for a switching element according to claim 11,
   wherein the threshold value is changed on the basis of a difference of electric potential between the input terminal and the output terminal of the switching element which is in an OFF state.

13. The driving method for a switching element according to claim 12,
   wherein the threshold value is changed when the difference of electric potential between the input terminal and the output terminal of the switching element which is in an OFF state has become less than a first prescribed voltage Vα such that the drive of the switching element is restricted.

14. The driving method for a switching element according to claim 13,
   wherein the threshold value is changed when the difference of electric potential between the input terminal and the output terminal of the switching element which is in an OFF state has become less than said first prescribed voltage Vα so as to be less than a value of an output current of the sense terminal which is in the OFF state; and suspending the drive of the switching element when a value of the output current has become more than said changed threshold value.

15. The driving method for a switching element according to claim 11, wherein
   the threshold value is changed on the basis of a difference of electric potential between the input terminal and the output terminal of the switching element which is in an ON state.

16. The driving method for a switching element according to claim 15, wherein
   the threshold value is changed when the difference of electric potential between the input terminal and the output terminal of the switching element which is in an ON state has become less than a second prescribed voltage Vγ such that the drive of the switching element is restricted.

17. The driving method for a switching element according to claim 16, wherein
   the threshold value is changed when the difference of electric potential between the Input terminal and the output terminal of the switching element which is in an ON state has become less than said second prescribed voltage Vγ so as to less than a value of an output current of the sense terminal which is in an OFF state; and
   suspending the drive of the switching element when a value of the output current has become more than said changed threshold value.

18. The driving method for a switching element according to claim 17, wherein the driving method further includes a step of
   correcting, on the basis of a temperature of the switching element, at least one of i) a difference of electric potential between the input terminal and the output terminal of the switching element for a changed threshold value or ii) said second prescribed voltage Vγ.

19. The driving method for a switching element according to claim 18, wherein the driving method is executed for an inverter which gives and receives an electric power to and from a rotating electrical machine.

20. The driving method for a switching element according to claim 11, wherein the switching element includes a collector and an emitter and the threshold value is changed so that the threshold value is set to a potential of the emitter.

* * * * *